(12) United States Patent
Patel

(10) Patent No.: US 6,590,469 B1
(45) Date of Patent: Jul. 8, 2003

(54) HIGH FREQUENCY, LARGE BANDWIDTH BALUN AND METHOD OF MANUFACTURING

(75) Inventor: Arun Patel, Langhorne, PA (US)

(73) Assignee: Pulse Engineering, Inc., San Diego, CA (US)

( * ) Notice: Subject to any disclaimer, the term of this patent is extended or adjusted under 35 U.S.C. 154(b) by 108 days.

(21) Appl. No.: 09/698,982

(22) Filed: Oct. 27, 2000

Related U.S. Application Data
(60) Provisional application No. 60/161,889, filed on Oct. 27, 1999.

(51) Int. Cl.[7] .................................................. H03H 7/42
(52) U.S. Cl. .......................................... 333/25; 333/32
(58) Field of Search .............................. 333/25, 26, 32; 336/182, 184, 186

(56) References Cited

U.S. PATENT DOCUMENTS

| | | | |
|---|---|---|---|
| 5,007,860 A | * 4/1991 | Robinson et al. ............ 439/540 |
| 5,117,167 A | 5/1992 | Kazmirski |
| 5,285,179 A | * 2/1994 | Wignot et al. ................ 334/15 |
| 5,363,068 A | 11/1994 | Georger |
| 5,420,551 A | * 5/1995 | Conte et al. .................. 333/12 |
| 5,742,213 A | 4/1998 | Reynolds |
| 5,808,518 A | * 9/1998 | McKinzie et al. ............ 333/26 |
| 6,100,772 A | * 8/2000 | Decramer et al. ............ 333/25 |
| 6,150,896 A | * 11/2000 | DeCramer et al. ............ 333/25 |
| 6,337,608 B1 | * 1/2002 | McLean et al. ............... 333/35 |

FOREIGN PATENT DOCUMENTS
EP     97 12 3008     12/1997

OTHER PUBLICATIONS
TOKO, 1999, Balun Transformers B4F, B5FL, B7T, web page catalog, 5 pages.*

* cited by examiner

*Primary Examiner*—Robert Pascal
*Assistant Examiner*—Dean Takaoka
(74) *Attorney, Agent, or Firm*—Knobbe, Martens, Olson & Bear, LLP

(57) ABSTRACT

A high frequency, large bandwidth electronic device for transforming balanced/unbalanced electrical signals. In one embodiment, the device comprises an auto-transformer mounted on substrate interposed between the balanced and unbalanced port so as minimize parasitic losses. Bonded bi-filar wire is wound around the auto-transformer core which facilitates a low, balanced leakage inductance thereby further enhancing device bandwidth. A method of manufacturing the aforementioned electronic device is also disclosed.

15 Claims, 6 Drawing Sheets

HIGH FREQUENCY, LARGE BANDWIDTH BALUN AND METHOD OF MANUFACTURING

RELATED APPLICATIONS

This application claims priority to U.S. Provisional Application No. 60/161,889, filed Oct. 27, 1999.

BACKGROUND OF THE INVENTION

1. Field of the Invention

The invention relates generally to the field of electronic components, and specifically to devices for transforming between balanced and unbalanced high frequency electrical signals.

2. Description of Related Technology

Balun (short for "balanced/unbalanced") devices are well known in the electrical arts. When connecting signal transmission or other similar lines, it is frequently necessary to connect a symmetric or balanced line (such as a television twin lead) to an asymmetric line (such as a coaxial cable). Balun devices act as the matching and signal transformation device which provides an interface between these two different types of lines. Most prior art balun devices are comprised at least in part of a common single winding transformer. Such single winding transformer devices are inherently limited in frequency response. Hence, prior art balun devices have been characteristically limited in both high frequency response (typically no greater than about 0.6 GHz) and usable bandwidth. In certain applications, such as differential mode measurements in high speed applications (e.g., Fibre Channel, Gigabit Ethernet, and MIL-STD 1553), frequency response and bandwidth greater than those provided by existing devices are highly desirable attributes. Furthermore, such prior art balun devices characteristically have a large footprint which is undesirable in many electronic applications where space is at a premium.

Hence, what is needed is a balun device which can be manufactured in a highly cost effective manner, yet provide enhanced high frequency response (in excess of 1.0 GHz) and usable bandwidth. Such device would also be small so as to minimize the required PCB area and volume consumed.

SUMMARY OF THE INVENTION

The foregoing needs are met by the present invention, which provides an improved balun device and method of manufacturing the same.

In a first aspect of the invention, an improved balun device having enhanced high frequency response and bandwidth is disclosed. In one exemplary embodiment, the balun comprises an auto-transformer electrically interposed between the balanced and unbalanced ports of the device. The auto-transformer allows for impedance matching and balanced-to-unbalanced (and unbalanced-to-balanced) signal transformation, and results in low winding resistance and low leakage inductance, which in turn results in low insertion loss and enhanced bandwidth. The device further incorporates a bonded bi-filar winding which facilitates a low balanced leakage inductance resulting in enhanced bandwidth. SMA connectors are also employed to control impedance, thereby facilitating higher frequency response. The compact physical design and termination scheme for the balanced port reduces parasitic losses, and the connection from transformer to the connector terminals is also very short, further reducing such losses. A trimming (adjusting) capacitance on the unbalanced port smooths return loss and aids in increasing bandwidth as well.

In a second aspect of the invention, a method of manufacturing the aforementioned balun device is disclosed. In one exemplary embodiment, this method comprises bonding the aforementioned bi-filar wire; wrapping this wire around the magnetically permeable core of the auto-transformer; mounting the assembled transformer on a substrate having electrically conductive areas on either side thereof; attaching a balanced port connector to the substrate and electrically connecting it thereto; and mating the unbalanced port connector to the substrate and electrically connecting this connector to the appropriate leads of the auto-transformer.

DETAILED DESCRIPTION OF THE INVENTION

Reference is now made to the drawings wherein like numerals refer to like parts throughout.

Figure 1A:
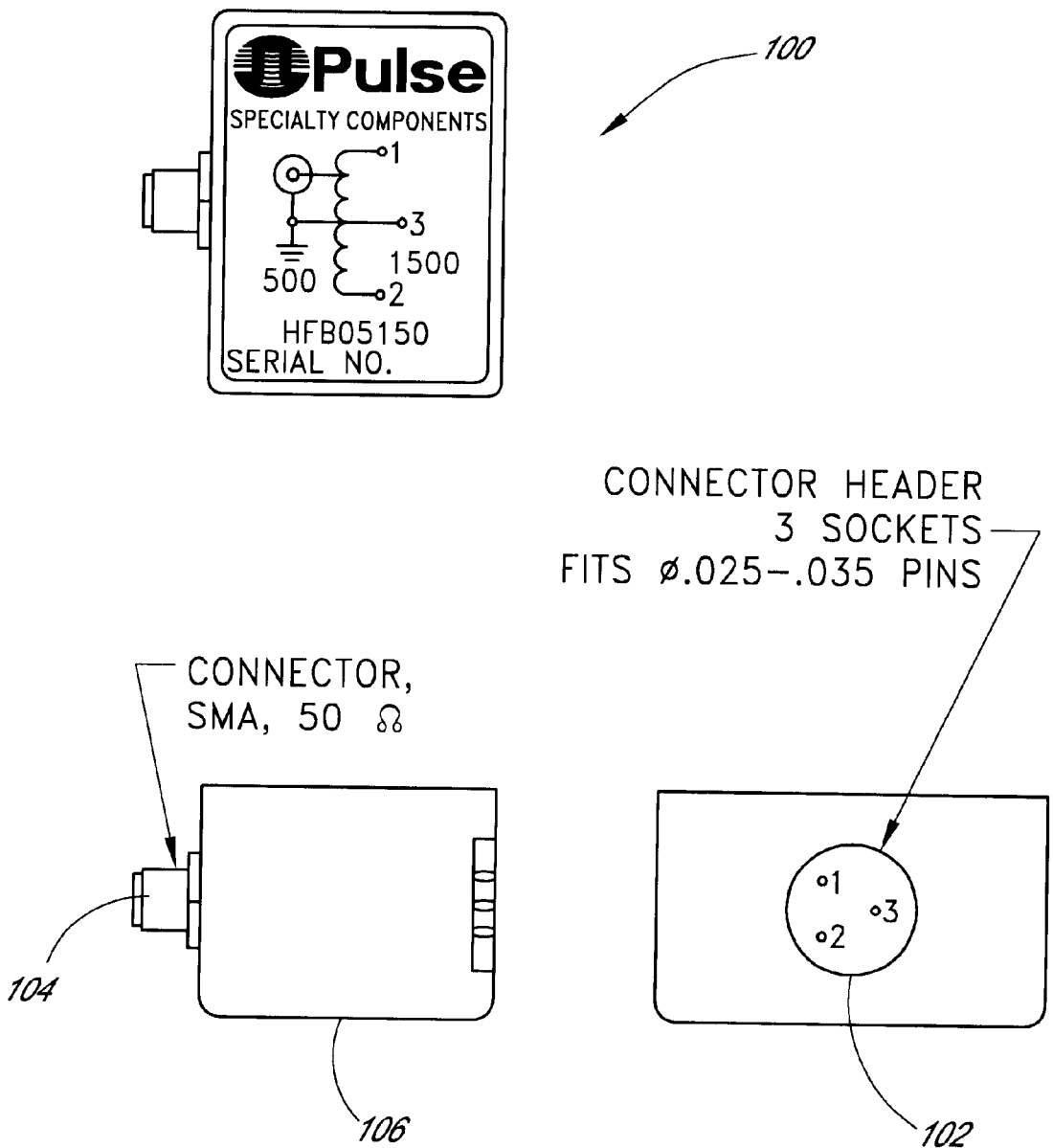
FIGS. 1a and 1b are a mechanical outline and application diagram, respectively, illustrating one exemplary embodiment of the balun of the present invention.

Referring now to FIG. 1a, one exemplary embodiment of the balun device (balun) according to the invention is described. As shown in FIG. 1a, the balun 100 comprises generally a balanced 3-socket port 102 and an unbalanced coaxial port 104 both penetrating a housing 106 of the balun 100. An SMA connector of the type well known in the art is utilized for the unbalanced port 104, while a three pin connector of the type also well known in the art is used for the balanced port 102. An SMA connector is a high frequency connector with repeatable electrical performance from direct current (dc) to several gigahertz. Such connectors are well suited to RF and other high frequency applications where size and performance are critical. It will be recognized, however, that other types of connectors may be used for either or both ports.

Figure 1B:
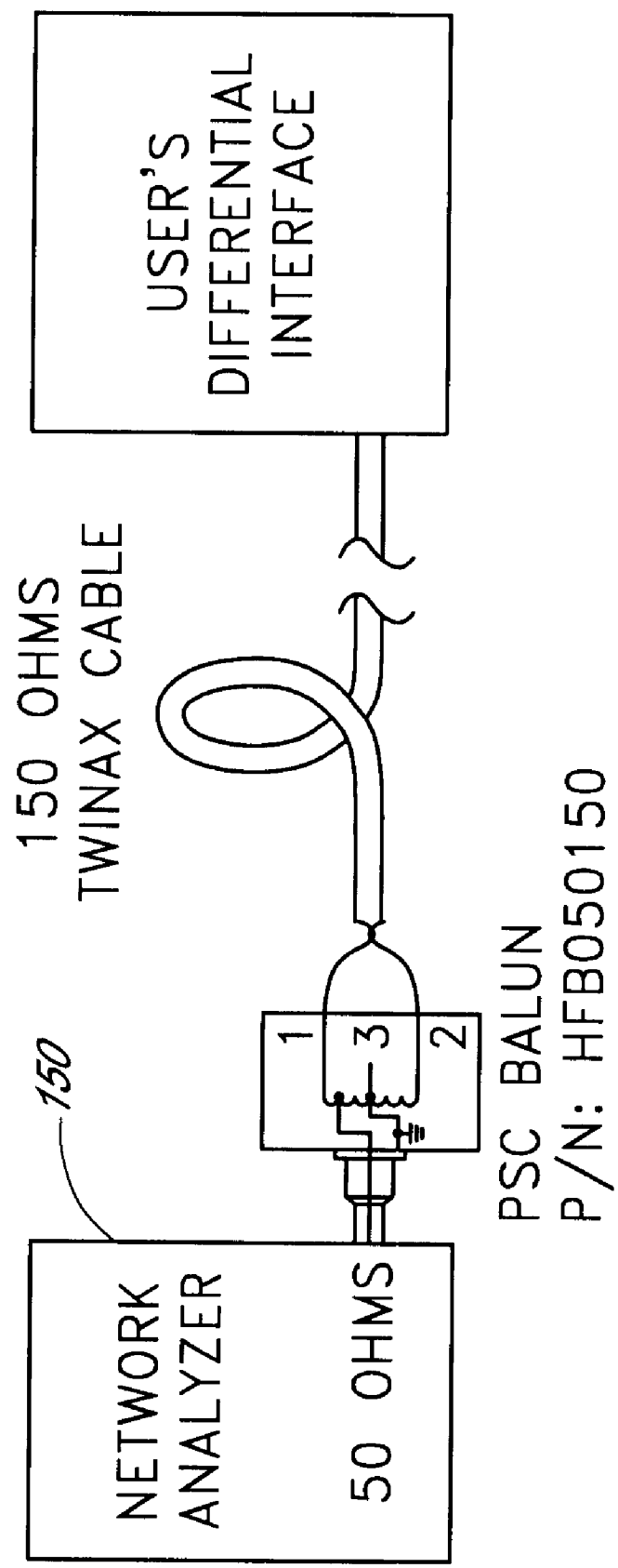

FIG. 1b illustrates one exemplary application of the balun 100 of FIG. 1. Specifically, a network analyzer 150 is connected via the unbalanced port 104 of the balun 100; the balanced port 102 of the balun 100 is connected to the user's differential signal interface. Such an arrangement allows for test/design engineers to characterize differential mode devices using single-ended test equipment as illustrated. Many other arrangements and uses for the balun device are possible, however.

Figure 2A:
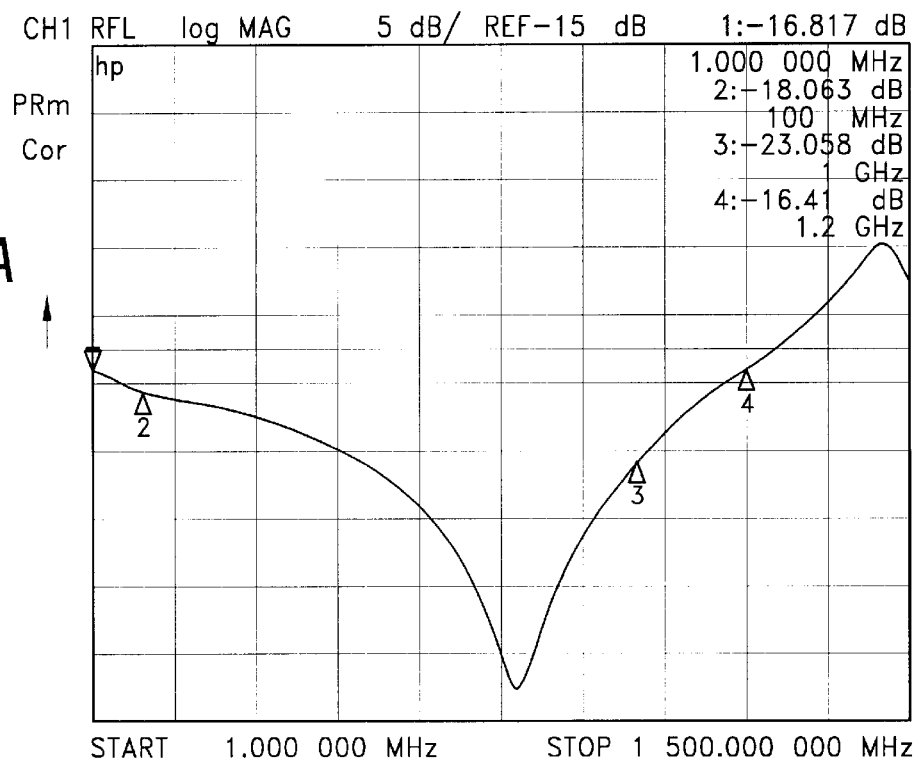
FIGS. 2a and 2b are plots of the return loss and insertion loss associated with the exemplary device of FIG. 1.
Figure 2B:
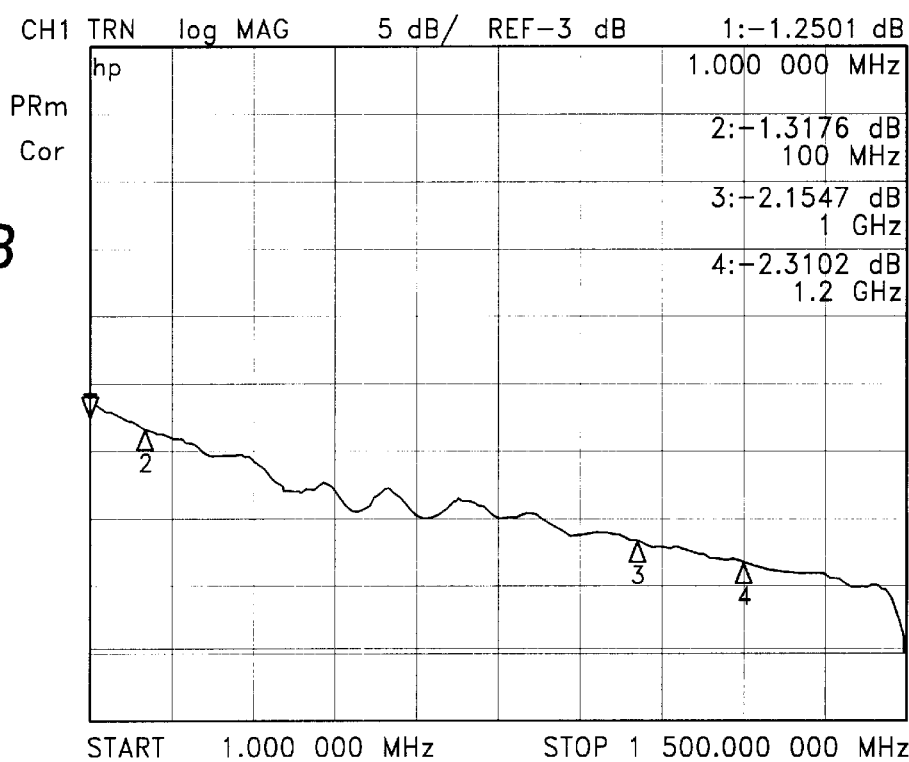

Referring now to FIGS. 2a and 2b, attributes of the performance of the exemplary balun 100 of FIG. 1 is illustrated. Specifically, in FIG. 2a, the return loss associated with the device is shown at various frequencies ranging from 0 MHz to 1.5 GHz. FIG. 2b illustrates the insertion loss of the device 100 also as a function of frequency.

Figure 3:
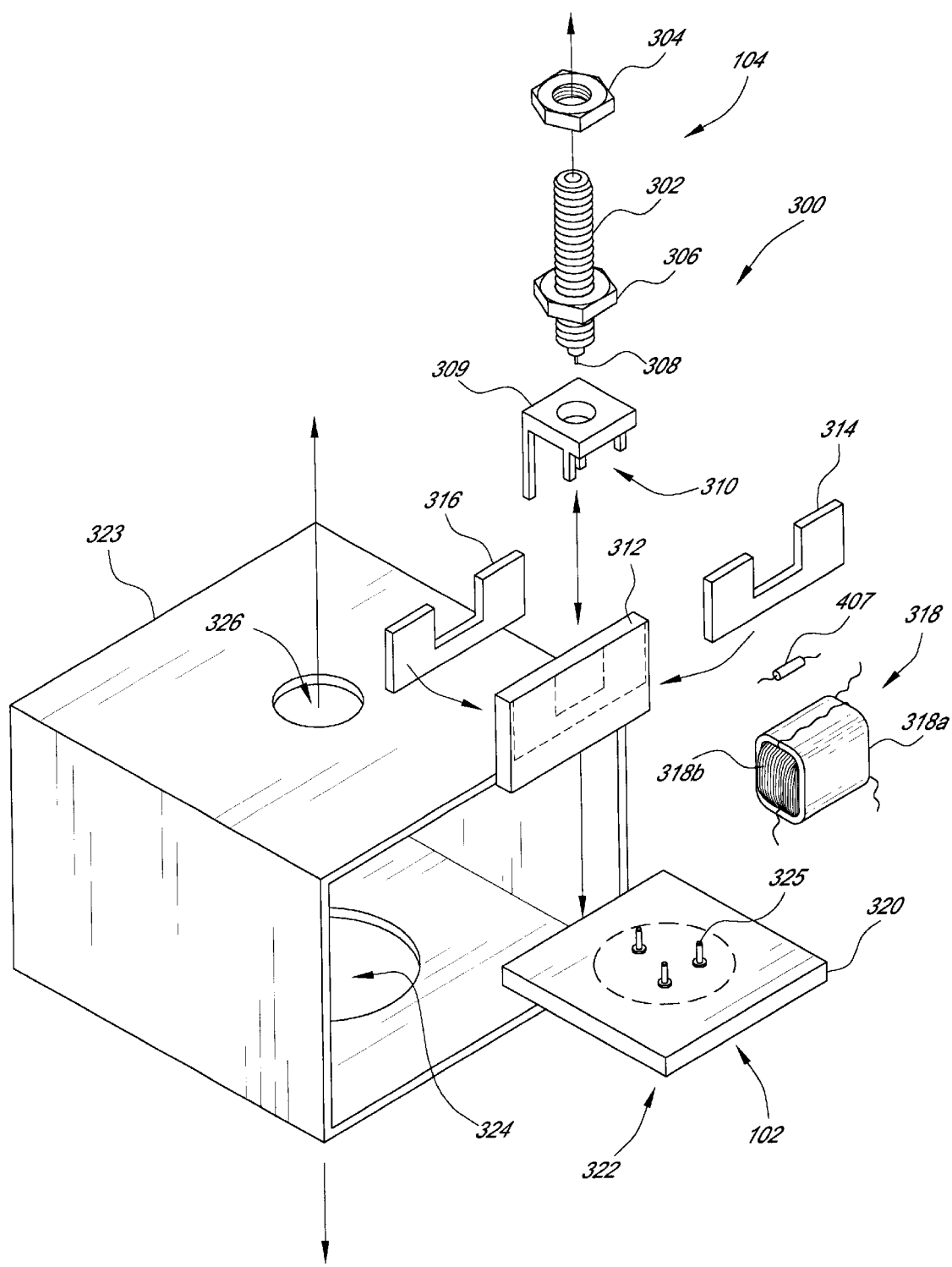
FIG. 3 is an assembly diagram of the balun of FIG. 1.
Figure 4A:
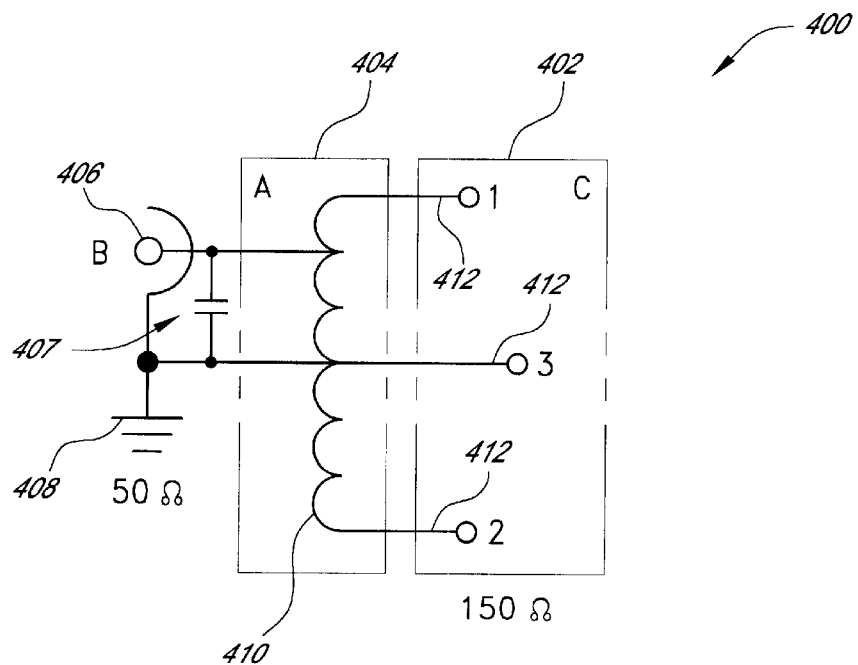
FIG. 4a is a schematic of a first exemplary embodiment of the balun of FIG. 1.
Figure 4B:
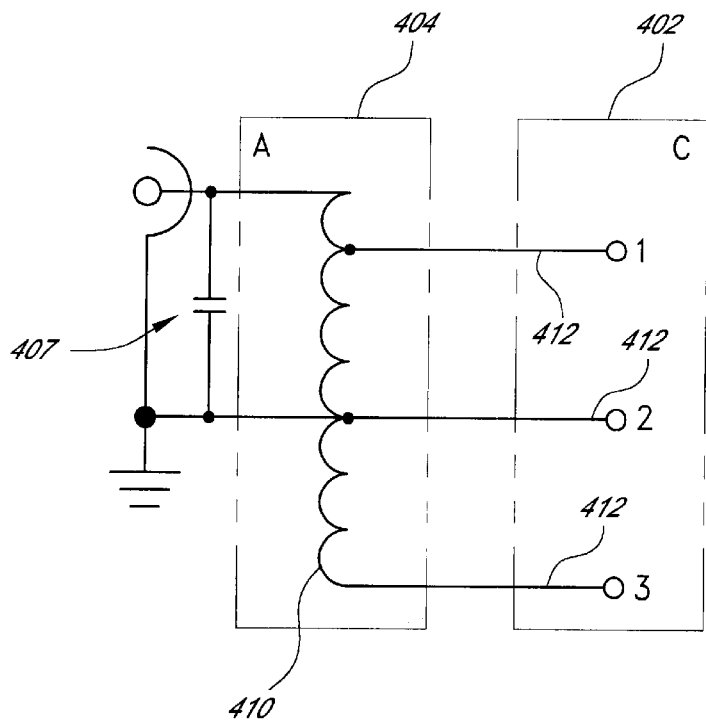
FIG. 4b is a schematic of a second exemplary embodiment of the balun of FIG. 1.

Referring now to FIG. 3, the construction of the balun of the present invention is described in greater detail. In the illustrated embodiment, the balun 300 comprises generally a threaded coaxial connector 302 with associated mounting nuts 304, 306 and coaxial center terminal 308, and adapter 309 having a slot 310 adapted to receive a substrate 312c (described further herein). The adapter 309 is rigidly fixed to the connector 302, and the outer terminal of the coaxial connector 302 is electrically connected to the adapter (see FIGS. 4a and 4b). The substrate receives an auto-transformer assembly 318, the latter being electrically connected between the balanced port 102 and unbalanced port 104 as shown in FIGS. 4a and 4b herein.

Two conductive plates or areas 316, 314 are disposed on either side of the substrate 312 in proximity to the adapter slot 310 so as to afford an electrical connection between the terminals of the adapter 309 and the auto-transformer 318. The center terminal 308 of the coaxial connector 302 is connected to the winding of the autotransformer 318, also shown in FIGS. 4A and 4B.

The auto-transformer of the illustrated embodiment comprises a core 318a and a bi-filar (i.e., two conductor bonded) winding 318b, the latter being wound in the desired number of turns on the core (depending on the desired transformation ratio) to produce magnetic coupling and signal transformation as is well known in the art. Use of such an auto-transformer 318 and bi-filar winding 318b in the balun 300 allows for impedance matching and balanced-to-unbalanced (and unbalanced-to-balanced) signal transformation. This arrangement further results in low winding resistance and low leakage inductance, which in turn results in low insertion loss (FIG. 2b) and enhanced bandwidth. The bonded bi-filar winding of the balun facilitates a low, balanced leakage inductance resulting in a broad bandwidth.

Additionaly, the SMA connector on the unbalanced port 104 allows for the control of impedance, thereby facilitating higher frequency response. Specifically, the long end-launch SMA connector of the illustrated embodiment minimizes impedance discontinuities from the substrate to the unbalanced side of the auto-transformer connection.

With respect to the balanced port 102, the present invention employs a compact physical design and termination scheme which reduces parasitic losses due to its minimal conductor length. For example, the electrical connections from the auto-transformer 318 to the connection terminals 325 on the connector are extremely short.

It is also noted that the balun of the illustrated embodiment optionally uses a trimming (adjusting) capacitance 407 on the unbalanced port which smooths the characteristic of the return loss (FIG. 2a) and increases device bandwidth. The trimming capacitance 407 is connected from the center terminal 308 of the unbalanced port to ground potential 408 (FIGS. 4a and 4b). A capacitance value in the microfarad ($\mu f$) range is used in the illustrated embodiment, although it will be appreciated that other capacitance values (or even a variable capacitor) may be substituted dependent on the particular application.

As shown in FIG. 3, the aforementioned components are contained with an outer housing 323 having apertures 324, 326 for receiving the balanced and unbalanced connectors 102, 104, respectively. In the illustrated embodiment, the housing is metallic, although other materials such as polymers (and indeed shapes of the housing) may be substituted depending on the needs of the user.

It will be recognized that an important attribute of the invention is the generally colinear arrangement of the components (i.e., unbalanced connector, adapter, substrate, transformer, and balanced connector) so as to minimize the length of all connections and terminations within the balun. These minimal length connections/terminations reduce, inter alia, parasitic effects which are highly detrimental to balun performance.

Referring now to FIG. 4a, a schematic representation 400 of a first exemplary embodiment of the balun device of the invention is described. The device comprises generally an auto-transformer coil 404 coupled electrically between the unbalanced port 406 and balanced port terminals 412. The center electrode of the coaxial connector is connected to one winding of the auto-transformer 404. Ground potential 408 is connected to the outer electrode of the coaxial connector of the unbalanced port 406, this ground potential also being connected to one of the three terminals of the balanced port 402. The operation of an auto-transformer is well known in the art, and accordingly will not be discussed further herein.

Referring now to FIG. 4b, a second exemplary embodiment of the balun of the present invention is described. In this embodiment, the center electrode of the unbalanced port 406 taps into the winding 410 at a different location than in the embodiment of FIG. 4a. Similarly, the number of winding turns is altered. It will be appreciated that the tapping location on the unbalanced port winding 410, as well as the physical configuration of the winding, may be altered for different impedance values or for other design considerations. Many such variations are possible, all considered within the scope of the invention disclosed herein.

Method of Manufacturing

Figure 5:
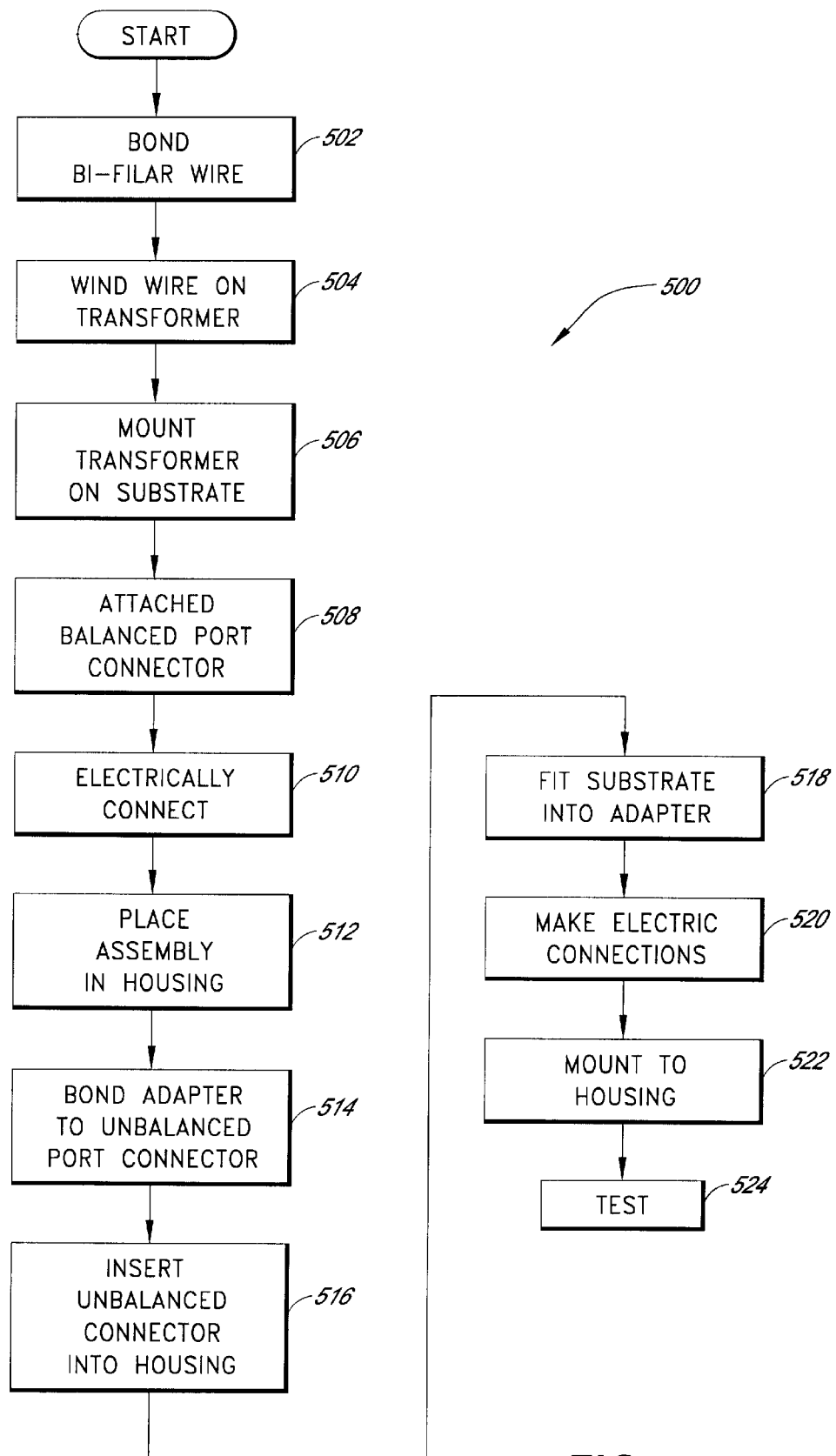
FIG. 5 is a flow diagram illustrating one exemplary embodiment of the method of manufacturing the balun of the present invention.

Referring now to FIG. 5, one exemplary embodiment of the method of fabricating a device as illustrated in FIGS. 1–4 is described. The method 500 of FIG. 5 comprises first bonding a bi-filar wire together in step 502. Next, the bonded bi-filar wire is wound around the auto transformer core in step 504. The auto-transformer is then mounted on the substrate in step 506, which has had electrically conductive areas formed thereon as illustrated in FIG. 3. The balanced port connector 102 is then mounted on the substrate 312 in step 508 as shown in FIG. 3. The electrical connections between the balanced port connector 102, auto-transformer windings 318b, and the conductive areas 314, 316 are then made in step 510, the length of the connections being minimized to the maximum extent possible as previously discussed. In the illustrated embodiment, a eutectic solder is used to form these connections by placing the solder in the desired location and elevating the temperature of the entire assembly above the melting point of the solder, although it will be appreciated that other techniques (both solder and non-solder) of forming the connections may be used. Next, in step 512, the partially assembled device (including balanced port connector, substrate, and auto-transformer) is placed within the housing 323. The adapter 309 is then bonded to the unbalanced port connector 104 in step 514, and the unbalanced connector with adapter fitted through its aperture in the housing in step 516. Next, the free end of the substrate 312 is fit into the adapter in step 518, and the conductive areas of the substrate bonded to the appropriate leads of the adapter and the auto-transformer in step 520. The trimming capacitance 407 is also optionally mounted and connected as part of this step 520. Lastly, the partially assembled balun device is mounted firmly within the housing 323 using the lock nuts 304, 306 of the unbalanced connector 104 in step 522, and the device tested in step 524.

The method disclosed herein has the benefits of requiring the minimal amount of process steps and labor, while still producing a device having enhanced bandwidth and high frequency response. It will be further noted that the design of the balun of the present invention purposely facilitates easy, low-cost manufacturing. Specifically, the "in-line" orientation of the components reduces material cost associated with longer leads, larger substrates, etc. The size of the enclosure housing the device can also be reduced as well.

It is also noted that while the method of manufacturing according to the present invention has been described in terms of a series of process steps, the order of these steps may be modified or permuted if desired. Also, steps may be added or deleted as appropriate to the configuration of a given embodiment. For example, the adapter 309 may be formed as part of the unbalanced connector 104 if desired, thereby obviating those process steps relating to attachment of the two components.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. An electronic device, comprising:

a first port having a first impedance;

a second port having a second impedance; and a transformer electrically connected between said first and second ports, wherein said transformer is configured to transform a first signal present at said first port to a second signal at said second port, wherein one of said first and second ports is a balanced port and one of said first and second ports is an unbalanced port, wherein said unbalanced port is configured to provide a trimming capacitance, and wherein said transformer comprises a bonded bi-filar winding.

2. The electronic device according to claim 1, wherein said device provides a frequency response between 1 MHz and 1.2 GHz.

3. The electronic device according to claim 1, wherein said device provides a frequency response up to 1 GHz.

4. The electronic device according to claim 1, wherein said device provides a frequency response above 0.6 GHz.

5. The electronic device according to claim 1, wherein said first port, said transformer and said second port are arranged substantially co-linearly.

6. The electronic device according to claim 1, wherein said balanced port comprises a 3-socket connector.

7. The electronic device according to claim 1, wherein said unbalanced port comprises a coaxial connector.

8. The electronic device according to claim 1, wherein said unbalanced port comprises an SMA connector.

9. An electronic device, comprising;

a balanced port having a first impedance;

an unbalanced port having a second impedance; and a transformer electrically connected between said balanced and unbalanced ports, wherein said transformer is configured to transform a first signal present at said balanced port to a second signal at said unbalanced port, wherein said unbalanced port is configured to provide a trimming capacitance, and wherein said transformer comprises a bonded bi-filar winding.

10. An electronic device, comprising;

a balanced port having a first impedance;

an unbalanced port having a second impedance and configured to provide a trimming capacitance; and a transformer electrically connected between said balanced and unbalanced ports, wherein said transformer is configured to transform a first signal present at said unbalanced port to a second signal at said balanced port, and wherein said transformer comprises a bonded bi-filar winding.

11. A method for manufacturing an electronic device, comprising, bonding a bi-filar wire;

wrapping said wire around a magnetically permeable core to form a transformer;

mounting said transformer on a substrate, said substrate having at least two electrically conductive areas;

electrically connecting a balanced port connector to at least one of said two electrically conductive areas; and electrically connecting an unbalanced port connector to said transformer, wherein said unbalanced port is configured to provide a trimming capacitance.

12. The method according to claim 11, wherein said unbalanced port connector and said balanced connector are mounted to said transformer substantially co-linearly.

13. The method according to claim 11, wherein said unbalanced port comprises a coaxial connector.

14. The method according to claim 11, wherein said unbalanced port comprises an SMA connector.

15. The method according to claim 11, wherein said balanced port comprises a 3-socket connector.

\* \* \* \* \*